United States Patent
Miyashita et al.

(10) Patent No.: US 6,414,977 B1
(45) Date of Patent: Jul. 2, 2002

(54) SEMICONDUCTOR LASER DEVICE

(75) Inventors: Motoharu Miyashita; Motoko Sasaki; Ken-ichi Ono, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/828,218

(22) Filed: Apr. 9, 2001

(30) Foreign Application Priority Data

Oct. 30, 2000 (JP) ........................................ 2000-330117

(51) Int. Cl.$^7$ ................................................. H01S 5/00
(52) U.S. Cl. .............................. 372/46; 372/43; 372/44; 372/45; 372/46; 372/47; 372/48; 372/49; 372/50
(58) Field of Search ..................... 372/43, 44, 45, 372/46, 47, 48, 49, 50

(56) References Cited

U.S. PATENT DOCUMENTS

| | | | | |
|---|---|---|---|---|
| 4,916,709 A | * | 4/1990 | Ota et al. ........................ | 372/45 |
| 5,757,835 A | * | 5/1998 | Ono et al. ...................... | 372/45 |
| 5,835,516 A | * | 11/1998 | Miyashita et al. ............. | 372/46 |
| 5,991,322 A | * | 11/1999 | Takiguchi et al. ............. | 372/50 |
| 6,345,064 B1 | * | 2/2002 | Fujii ................................ | 372/34 |

OTHER PUBLICATIONS

Imafuji et al., "Low Operating Current And High Temperature Operation Of 650nm AlGaInP Visible Laser Diodes With Real Refractive Index Guided Self–Aligned Structure", Electronic Letters, vol. 33, No. 14, Jul. 1997, pp. 1223–1225.

Fukuhisa et al., "Epitaxial Growth Of AlGaInP On AlGaInP Grooved Structure BY MOVPE", Proceedings of the Tenth International Conference on MOVPE, 2000, pp. 82–83.

* cited by examiner

Primary Examiner—Paul Ip
Assistant Examiner—Delma R. Flores Ruiz
(74) Attorney, Agent, or Firm—Leydig, Voit & Mayer, Ltd.

(57) ABSTRACT

A semiconductor laser device exhibiting a reduced threshold current with less deterioration in temperature properties in current-optical output performance and excellent beam properties. The semiconductor laser device has a current blocking layer of n-AlInP having a stripe-shaped opening disposed on a first upper cladding layer, the first upper cladding layer and the current blocking layer facing the opening respectively are covered by a buffer layer of p-$Al_{0.7}Ga_{0.5}As$ and a second upper cladding layer of p-$(Al_{0.7}Ga_{0.3})_{0.5}In_{0.5}P$ is disposed on the buffer layer, to prevent lattice defect formation during growth of a crystalline layer on the surface of the current blocking layer facing the opening.

4 Claims, 10 Drawing Sheets

SEMICONDUCTOR LASER DEVICE

BACKGROUND OF THE INVENTION

1. Field of the Invention

This invention relates to a semiconductor laser device and a manufacturing method thereof. In particular, it relates to a semiconductor laser device used to process optical information and a manufacturing method thereof.

2. Description of the Related Art

A semiconductor laser device for optical information processing has conventionally employed a gain guided structure using a GaAs current blocking layer. Recently, there has been, however, developed a semiconductor laser device which employs a real refractive index guided structure using an AlInP layer as a current blocking layer to reduce an operating current.

A real refractive index guided structure may reduce an optical absorption loss in a current blocking layer resulting in not only a reduced threshold current but also an improved luminous efficiency, therefore a reduced operating current.

This technical trend has been driven for developing semiconductor laser device shaving a higher output. Conventional optical information processing involves only reading as in, for example, DVD-ROM, which does not require very high output. Recent optical information processing involves, however, not simply reading but also writing on a recording medium as in, for example, DVD-RW or DVD-R, which necessarily requires a higher output. It has been, therefore, required that an internal loss is minimized to reduce an operating current for improving temperature properties of the semiconductor laser device and thus reliability under a high output.

FIG. 14 is a cross-sectional view of a conventional SAS (Self-Aligned Structure) type of red semiconductor laser diode (hereinafter, referred to as a "red LD") described in Electronics Letters, Vol. 33, No. 14 (1997), pp.1223–5.

In FIG. 14, reference numeral 100 denotes a red LD, 102 an n-type GaAs substrate (hereinafter, n-type and p-type are denoted as "n-" and "p-", respectively), 104 an n-GaAs buffer layer, 106 a lower clad layer made of n-$(Al_{0.7}Ga_{0.3})_{0.5}In_{0.5}P$, and 108 an active layer of an MQW structure made of GaInP/AlGaInP where GaInP is a material for a well layer and AlGaInP is a material for a barrier layer.

In this figure, reference numeral 110 denotes a first upper clad layer made of p-$(Al_{0.7}Ga_{0.3})_{0.5}In_{0.5}P$, 112 a current blocking layer made of n-AlInP, 114 a stripe-shaped opening to be a current channel in the current blocking layer 112, 116 a second upper clad layer made of p-$(Al_{0.7}Ga_{0.3})_{0.5}In_{0.5}P$, 118 a p-GaAs contact layer, 120 a p-electrode, and 122 an n-electrode.

There will be described a process for manufacturing this semiconductor laser device 100.

FIGS. 15, 16 and 17 are cross-sectional views of a conventional red LD in individual manufacturing steps.

First, on an n-GaAs substrate 102 are sequentially deposited an n-GaAs layer to be a buffer layer 104, an n-$(Al_{0.7}Ga_{0.3})_{0.5}In_{0.5}$ layer to be a lower clad layer 106, a GaInP/AlGaInP MQW layer to be an active layer 108, a p-$(Al_{0.7}Ga_{0.3})_{0.5}In_{0.5}P$ layer to be a first upper clad layer 110 and an n-AlInP layer to be a current blocking layer 112, by primary epitaxial growth based on crystal growth such as MOCVD. For dopants, silicon is used as an n-type dopant while zinc is used as a p-type dopant. The result of this step is shown in FIG. 15.

Then, a resist pattern 126 is formed on the surface of the n-AlInp layer to be a current blocking layer 112 by a photolithographic process, and a stripe-shaped opening 114 to be a current path is formed in the n-AlInP layer to be the current blocking layer 112 by wet etching. The result of this step is shown in FIG. 16.

After removing the resist pattern 126, a p-$(Al_{0.7}Ga_{0.3})_{0.5}In_{0.5}P$ layer to be a second upper clad layer 116 is formed on the p-$(Al_{0.7}Ga_{0.3})_{0.5}In_{0.5}P$ layer to be a first upper clad layer 110 facing the opening 114 and the n-AlInP layer to be a current blocking layer 112 by secondary epitaxial growth based on crystal growth such as MOCVD. The result of this step is shown in FIG. 17.

Then, a p-GaAs layer to be a contact layer 118 is formed on the p-$(Al_{0.7}Ga_{0.3})_{0.5}In_{0.5}$ layer to be a second upper clad layer 116.

In this process, crystal growth temperature is about 650° C. to 750° C. A crystal growth temperature as low as possible is used to prevent the p-type dopant, Zn, from diffusing from the p-$(Al_{0.7}Ga_{0.3})_{0.5}In_{0.5}P$ layer, as the first upper clad layer 110, into the MQW layer, the active layer 108, to the maximum extent possible.

Then, a p-electrode 120 and an n-electrode 122 are formed on the surface of the p-GaAs layer to be a contact layer I 10 and on the rear surface of the n-GaAs substrate 102, respectively.

A conventional red LD 100 has a configuration as described above. When forming the p-$(Al_{0.7}Ga_{0.3})_{0.5}In_{0.5}P$ layer for the second upper clad layer 116 on the n-AlInP layer for the current blocking layer 112 in the manufacturing process for the red LD 100 as illustrated in FIG. 17, lattice defects frequently develop on the surface facing the opening 114 in the n-AlInP layer for the current blocking layer 112, leading to an increase in internal loss of light, deterioration in temperature properties, and poor reliability of the red LD 100.

A technique for preventing lattice defects in crystal growth has been described in Proceedings of the Tenth International Conference on Metal organic Vapor Phase Epitaxy (2000), p. 82. In the report, an $(Al_{0.7}Ga_{0.3})_{0.51}In_{0.49}P$ layer is deposited on a GaAs substrate which is a (100) facet misoriented by 10° toward [011] direction. Then, on the layer is formed an $Al_{0.51}In_{0.49}P$ layer having a grooved structure whose side wall is a (111) A facet, and with $Ga_{0.51}In_{0.49}P$ as a marker sandwiched in between, an $(Al_{0.7}Ga_{0.3})_{0.51}In_{0.49}P$ layer is formed above the $(Al_{0.7}Ga_{0.3})_{0.51}In_{0.49}P$ layer parallel to the GaAs substrate exposed in the bottom of the grooved structure and above the $Al_{0.51}In_{0.49}P$ layer having a (111) A facet, during which development of lattice defects is studied using the then substrate temperature as a parameter.

According to the report, crystal growth was caused at substrate temperatures of 720° C., 760° C. and 800° C. It was found that lattice defects developed in a crystal layer growing on a (111) A facet at a substrate temperature of 720° C. or 760° C., while crystal growth at a substrate temperature of 800° C. reduced lattice defects in the $(Al_{0.7}Ga_{0.3})_{0.51}In_{0.49}P$ layer on a (111) A facet.

However, for a red LD, a crystal growth temperature of 800° C. may cause diffusion of the p-type dopant Zn from the p-$(Al_{0.7}Ga_{0.3})_{0.5}In_{0.5}P$ layer as a first upper clad layer 110 to the MQW layer to be an active layer 108, leading to deterioration in temperature properties or reliability in current-optical output performance.

Besides the prior art described above, JP-B 2842465 has disclosed an SAS type semiconductor laser where on the surface of a current blocking layer made of AlGaAs material having a stripe-shaped opening is deposited a protective layer made of an AlGaAs material with small aluminum content, on which a p-AlGaAs material is deposited as a p-clad layer, but has not described that on a current blocking layer made of an AlInP material are formed a capping layer made of a GaInP material and a p-$(Al_{0.7}Ga_{0.3})_{0.5}In_{0.5}P$ layer.

SUMMARY OF THE INVENTION

The present invention has been made to solve the above problem in the art, and an objective of this invention is to provide a reliable semiconductor laser device exhibiting a reduced threshold current with less deterioration in temperature properties in current-optical output performance.

A semiconductor laser device according to the present invention comprises: a semiconductor substrate of a first conductivity type; a first clad layer of a first conductivity type made of a III-V group compound semiconductor disposed on the semiconductor substrate; an active layer made of a III-V group compound semiconductor having a smaller band gap than the first clad layer, disposed on the first clad layer; a first second-clad layer of a second conductivity type made of a III-V group compound semiconductor having a larger band gap than the active layer, disposed on the active layer; a current blocking layer of a first conductivity type made of a III-V group compound semiconductor having a larger band gap than the active layer, disposed on the first second-clad layer and having a stripe-shaped opening to be a current path; a buffer layer of a second conductivity type made of a III-V group compound semiconductor having a larger band gap than the active layer, disposed on the surface of the current blocking layer facing the opening; and a second second-clad layer of a second conductivity type made of a III-V group compound semiconductor having a larger band gap than the active layer, disposed on the first second-clad layer facing the opening and the current blocking layer via the buffer layer.

Accordingly, a semiconductor laser device according to the present invention is advantageous in that lattice defects in the second second-clad layer disposed on the surface of the current blocking layer facing the opening via the buffer layer may reduce and it can be prevented from a second conductivity type of dopant diffusing from the first second-clad layer to the active layer. Therefore the construction according to the present invention makes it possible to reduce deterioration in temperature properties in current-optical output performance, and consequently to improve reliability of the semiconductor laser device.

Another objective of this invention is to lead to improvement in reliability of a semiconductor laser device with a red LD.

A semiconductor laser device according to the present invention comprises: a semiconductor substrate of a first conductivity type; a first clad layer of a first conductivity type made of a III-V group compound semiconductor disposed on the semiconductor substrate; an active layer made of a III-V group compound semiconductor having a smaller band gap than the first clad layer, disposed on the first clad layer; a first second-clad layer of a second conductivity type made of a III-V group compound semiconductor having a larger band gap than the active layer, disposed on the active layer; a current blocking layer of a first conductivity type made of an AlInP material having a larger band gap than the active layer, disposed on the first second-clad layer and having a stripe-shaped opening to be a current path; a protective layer made of a GaInP material disposed on the surface of the current blocking layer except the surface facing the opening; and a second second-clad layer of a second conductivity type made of an AlGaInP material having a larger band gap than the active layer, disposed on the current blocking layer via the protective layer and the first second-clad layer facing the opening.

Accordingly, a semiconductor laser device according to the present invention is advantageous that because the current blocking layer made of the AlInP material is protected by the GaInP material not containing Al the second second-clad layer made of the AlGaInP material whose composition tends to be deviated is disposed on the crystal facet with a reduced amount of oxide film. Consequently reducing a risk of lattice defect formation leads to improvement in reliability of a semiconductor laser device with a red LD.

A further objective of this invention is to provide a process for manufacturing a reliable semiconductor laser device exhibiting a reduced threshold current with less deterioration in temperature properties in current-optical output performance by simple steps.

A process for manufacturing a semiconductor laser device according to the present invention includes the steps of: depositing a first clad layer of a first conductivity type made of a III-V group compound semiconductor, an active layer made of a III-V group compound semiconductor having a smaller band gap than the first clad layer, a first second-clad layer of a second conductivity type made of a III-V group compound semiconductor having a larger band gap than the active layer, and a current blocking layer of a first conductivity type made of a III-V group compound semiconductor having a larger band gap than the active layer on the first second-clad layer in order, on a semiconductor substrate of a first conductivity type; forming a stripe-shaped opening penetrating the current blocking layer; forming a buffer layer of a second conductivity type made of a III-V group compound semiconductor having a larger band gap than the active layer on the surface of the current blocking layer facing the opening; and forming a second second-clad layer of a second conductivity type made of a III-V group compound semiconductor having a larger band gap than the active layer on the first second-clad layer facing the opening and the current blocking layer via the buffer layer.

Accordingly, a process for manufacturing a semiconductor laser device according to the present invention is advantageous that because the crystal of the second second-clad layer may grow with reduced lattice defects on the surface of the current blocking layer facing the opening via the buffer layer even at a common substrate temperature and such a common substrate temperature may reduce diffusion of a second conductivity type of dopant from the first second-clad layer to the active layer during crystal growth, a reliable semiconductor laser device with reduced deterioration in temperature properties in current-optical output performance can be manufactured by simple steps. Consequently, a semiconductor laser device exhibiting excellent laser properties can be produced with a low price.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference number.

DESCRIPTION OF THE PREFERRED EMBODIMENT

First Embodiment

There will be described, as an example, an SAS type red LD used for information processing.

In a red LD according to Embodiment 1, a current blocking layer made of n-AlInP having a stripe-shaped opening is disposed on a first upper clad layer, a buffer layer made of p-$Al_{0.5}Ga_{0.5}As$ covers the first upper clad layer and the current blocking layer facing the opening, and a second upper clad layer made of p-$(Al_{0.7}Ga_{0.3})_{0.5}In_{0.5}P$ is disposed on the buffer layer to prevent lattice defects from developing in a crystal layer grown on the surface of the current blocking layer facing the opening.

Figure 1:
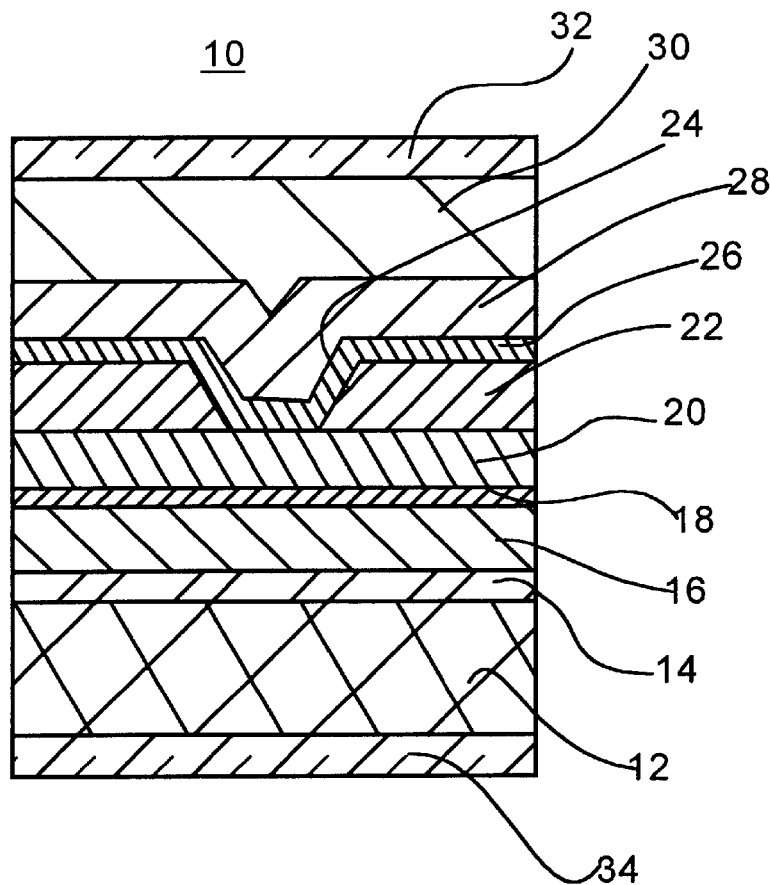
FIG. 1 is a cross-sectional view of the red LD according to the present invention.

FIG. 1 is a cross-sectional view of the red LD according to Embodiment 1 of this invention.

In FIG. 1, reference numeral 10 denotes a red LD, 12 an n-GaAs substrate; 14 an n-GaAs first buffer layer disposed on the main surface of the substrate 12; 16 a lower clad layer as a first clad layer made of n-$(Al_{0.7}Ga_{0.3})_{0.5}In_{0.5}P$ disposed on the first buffer layer 14; and 18 an MQW structure of active layer made of GaInP/AlGaInP disposed on the lower clad layer 16 where GaInP is a material for a well layer and AlGaInP is a material for a barrier layer.

Then, reference numeral 20 denotes a first upper clad layer as a first second-clad layer made of p-$(Al_{0.7}Ga_{0.3})_{0.5}In_{0.5}P$ disposed on the active layer 18; 22 a current blocking layer made of n-$Al_{0.5}In_{0.5}P$ disposed on the first upper clad layer 20; and 24 a stripe-shaped opening to be a current channel formed in the current blocking layer 22. The longitudinal direction of the opening 24 is an output direction of a laser beam and the surface facing the opening 24 in the current blocking layer 22 is a (111) A facet.

Then, reference numeral 26 denotes a second buffer layer as a buffer layer made of, for example, p-$Al_{0.5}Ga_{0.5}As$. The Al content in the second buffer layer 26 is adjusted such that a band gap in the second buffer layer 26 is larger than that in the active layer 18, for avoiding absorption of a laser beam from the active layer 18. The material for the second buffer layer 26 is, therefore, selected in the light of the band gap in the active layer 18.

Since a wavelength of the active layer 18 is 650 nm to 660 nm, an Al content x in p-$Al_xGa_{1-x}$. As of the second buffer layer 26 is 0.4 to 1, preferably 0.5 to 0.7.

The second buffer layer 26 covers the surface of the exposed first upper clad layer 20 facing the opening 24, the (111) A facet of the current blocking layer 22 facing the opening 24 and the upper surface of the current blocking layer 22.

The thickness of the second buffer layer 26 must be 10 nm or more. For example, it is about 10 nm to 100 nm for an Al content x=0.5.

Then, reference numeral 28 denotes a second upper clad layer as a second second-clad layer made of p-$(Al_{0.7}Ga_{0.3})_{0.5}In_{0.5}P$ disposed on the surface of the current blocking layer 22; 30 a contact layer made of p-GaAs disposed on the second upper clad layer 28; 32 a p-electrode disposed on the surface of the contact layer; and 34 an n-electrode disposed on the rear surface of the substrate 12.

Figure 2:
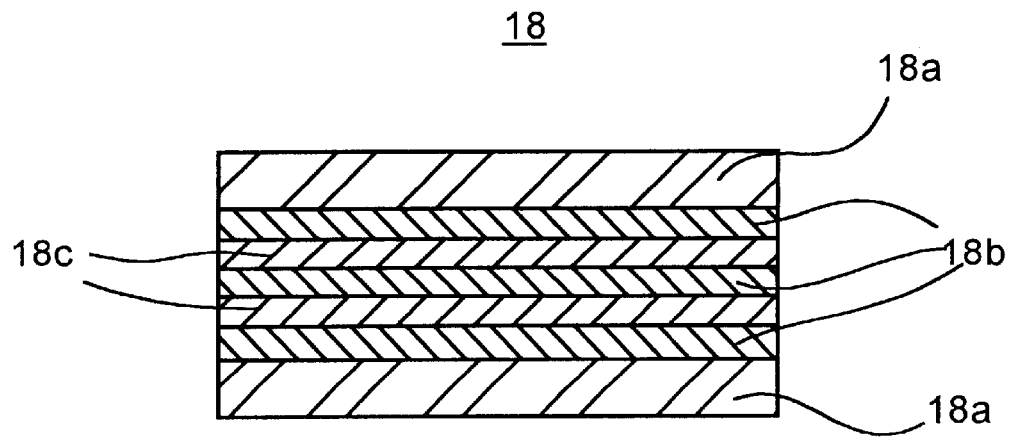
FIG. 2 is a cross-sectional view of the MQW structure in the active layer according to the present invention.
Figure 3:
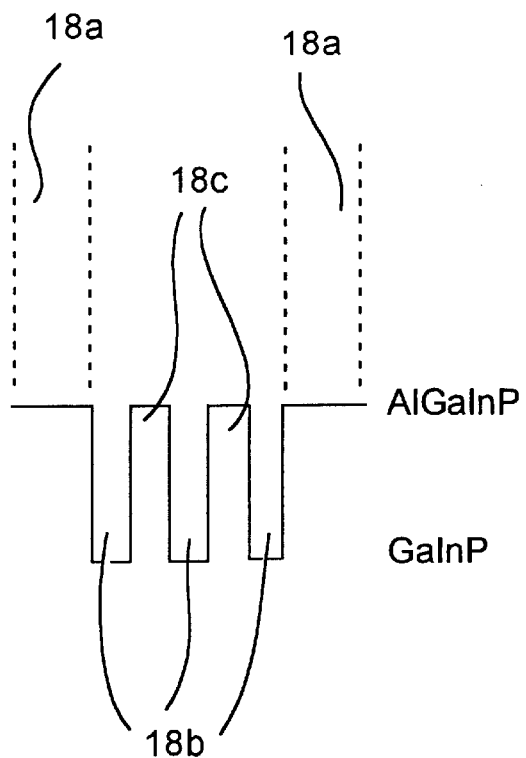
FIG. 3 is a schematic view of an energy band for the MQW in the active layer according to the present invention.

FIG. 2 is a cross-sectional view of an MQW structure in the active layer 18 and FIG. 3 is a schematic view of an energy band for the MQW in the active layer 18.

In FIGS. 2 and 3, reference numeral 18a denotes an optical guide layer, adjacent to which is formed a quantum well layer 18b inside of the active layer 18. A barrier layer 18c is deposited, which is sandwiched by the quantum well layers 18b. The thickness of the quantum well layer 18b and the barrier layer 18c is, for example, about 6 nm.

There will be described a process for manufacturing a red LD 10.

Figure 4:
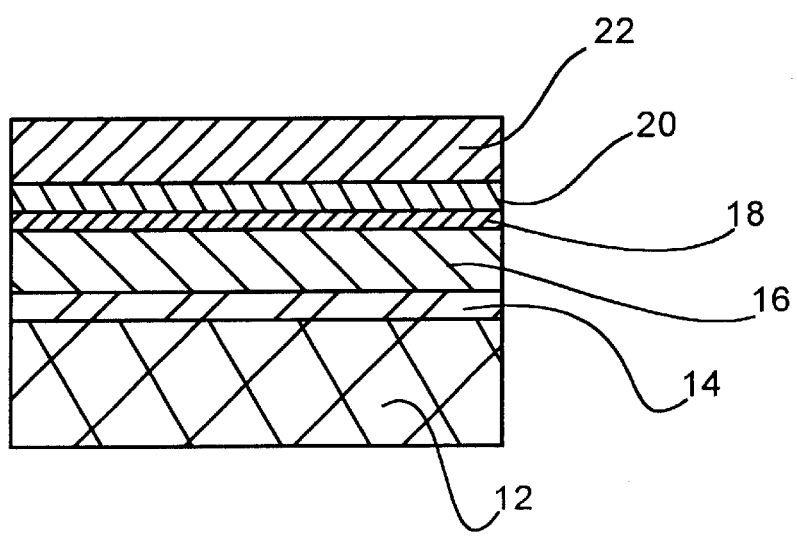
FIG. 4 is a cross-sectional view of the red LD in a manufacturing step according to the present invention.
Figure 5:
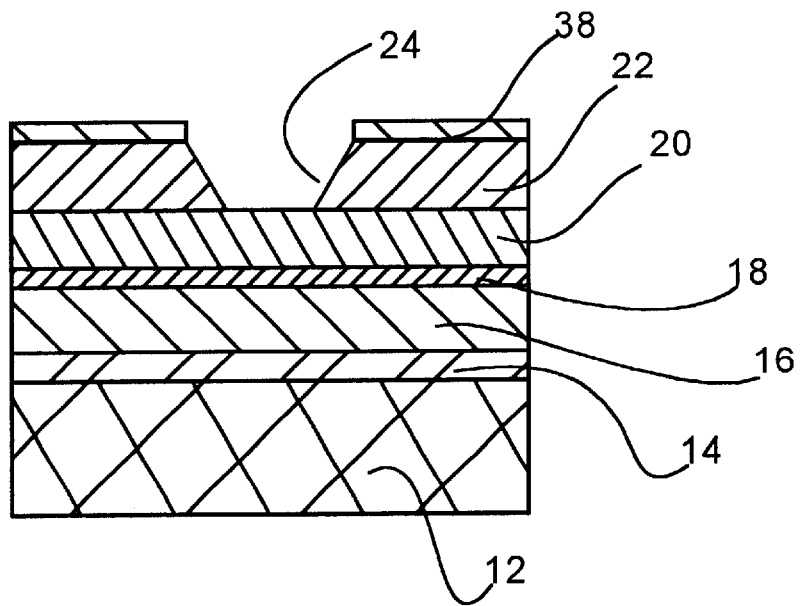
FIG. 5 is a cross-sectional view of the red LD in a manufacturing step according to the present invention.
Figure 6:
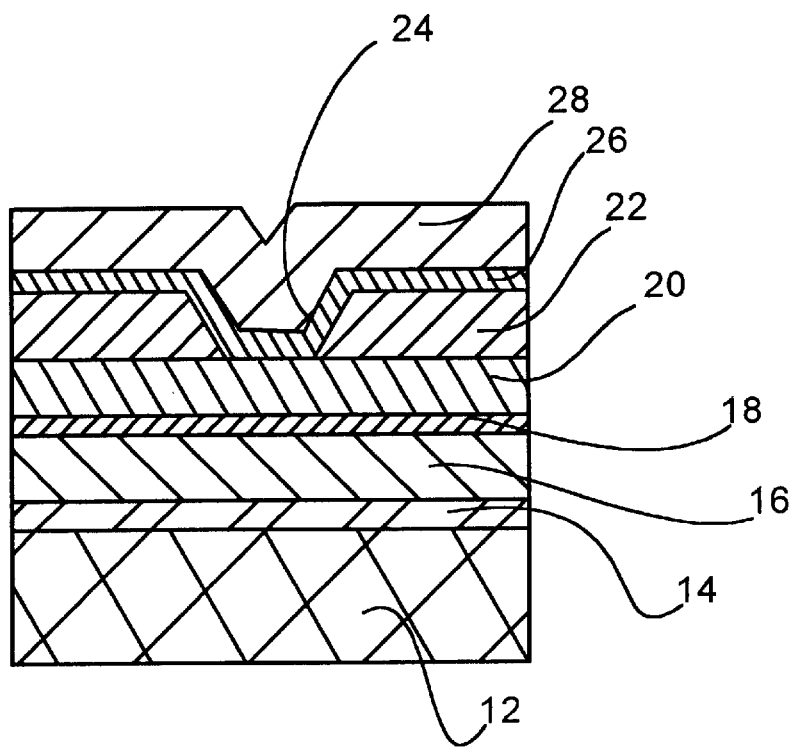
FIG. 6 is a cross-sectional view of the red LD in a manufacturing step according to the present invention.

FIGS. 4, 5 and 6 are cross-sectional views of the red LD in individual manufacturing steps according to Embodiment 1.

On an n-GaAs substrate 12 are sequentially deposited an n-GaAs layer to be a first buffer layer 14, an n-$(Al_{0.7}Ga_{0.3})_{0.5}In_{0.5}$ layer to be a lower clad layer 16, a GaInP/AlGaInP MQW layer to be an active layer 18, a p-$(Al_{0.7}Ga_{0.3})_{0.5}In_{0.5}P$ layer to be a first upper clad layer 20 and an n-$Al_{0.5}In_{0.5}P$ layer to be a current blocking layer 22, by primary epitaxial growth based on crystal growth such as MOCVD. For a dopant, an n-type dopant is silicon while a p-type dopant is zinc. The result of this step is shown in FIG. 4.

Then, a resist pattern 38 is formed on the surface of the n-$Al_{0.5}In_{0.5}P$ layer to be a current blocking layer 22 by a photolithographic process, and a stripe-shaped opening 24 to be a current path is formed in the n-$Al_{0.5}In_{0.5}P$ layer to be the current blocking layer 22 by wet etching. The result of this step is illustrated in FIG. 5.

After removing the resist pattern 38, a p-$Al_{0.5}Ga_{0.5}As$ layer to be a second buffer layer 26 is formed on the surface of the exposed p-$(Al_{0.7}Ga_{0.3})_{0.5}In_{0.5}P$ layer to be a first upper clad layer 20 facing the opening 24, the (111) A facet facing the opening 24 in the n-$Al_{0.5}In_{0.5}P$ layer to be a current blocking layer 22 and the upper surface of the p-$(Al_{0.7}Ga_{0.3})_{0.5}In_{0.5}P$ layer by secondary epitaxial growth based on crystal growth such as MOCVD. On the second buffer layer 26 is formed a p-$(Al_{0.7}Ga_{0.3})_{0.5}In_{0.5}P$ layer to be a second upper clad layer 28. The result of this step is shown in FIG. 6.

Then, a p-GaAs layer to be a contact layer 30 is formed on the p-$(Al_{0.7}Ga_{0.3})_{0.5}In_{0.5}P$ layer to be a second upper clad layer 28.

In this secondary epitaxial growth, a crystal growth temperature is about 650° C. to 750° C. A crystal growth temperature as low as possible is selected to prevent a p-type dopant Zn from diffusing from the p-$(Al_{0.7}Ga_{0.3})_{0.5}In_{0.5}P$ layer as a first upper clad layer 20 to the MQW layer to be an active layer 18 as much as possible.

Then, a p-electrode 32 and an n-electrode 34 are formed on the surface of the p-GaAs layer to be a contact layer 30 and the rear surface of the n-GaAs substrate 12, respectively, to provide a red laser LD 10 shown in FIG. 1.

There will be described operation of the red LD 10.

When applying a forward direction voltage between the n-electrode 34 and the p-electrode 32, current flow is blocked by a depletion layer generated by a p-n junction between the current blocking layer 22 and the second upper clad layer 28 to reduce a current and to make the current flow through the opening 24 to the active layer 18.

A current higher than a given threshold to the active layer 18 causes recombination of electrons and positive holes in the active layer 18, whereby a laser beam is emitted.

The lower clad layer 16, the first upper clad layer 20 and the second upper clad layer 28 have a larger band gap than that of the active layer 18. The refractive indices of lower clad layer 16, the first upper clad layer 20 and the second upper clad layer 28 are smaller than that of the active layer 18, so that the laser beam is enclosed between the lower clad layer 16 and the first and the second upper clad layers 20, 28.

The band gap of the current blocking layer 22 is larger than those of the first upper clad layer 20 and the second upper clad layer 28, while the real refractive index of the current blocking layer 22 is smaller than those of the first upper clad layer 20 and the second upper clad layer 28, so that diffusion in a horizontal lateral direction of the laser beam is inhibited by the current blocking layer 22.

Thus, this red LD 10 has a configuration such that there are real refractive index differences in both vertical and horizontal directions at the emission point of the laser beam, whereby the laser may be effectively enclosed around the emission point.

There will be discussed the reason why in a conventional red LD 100, lattice defects may be frequently formed on the surface facing the opening 114 in the n-AlInP layer to be a current blocking layer 112 when forming the p-$(Al_{0.7}Ga_{0.3})_{0.5}In_{0.5}P$ layer to be a second upper clad layer 116 on the current blocking layer 112.

Figure 7:
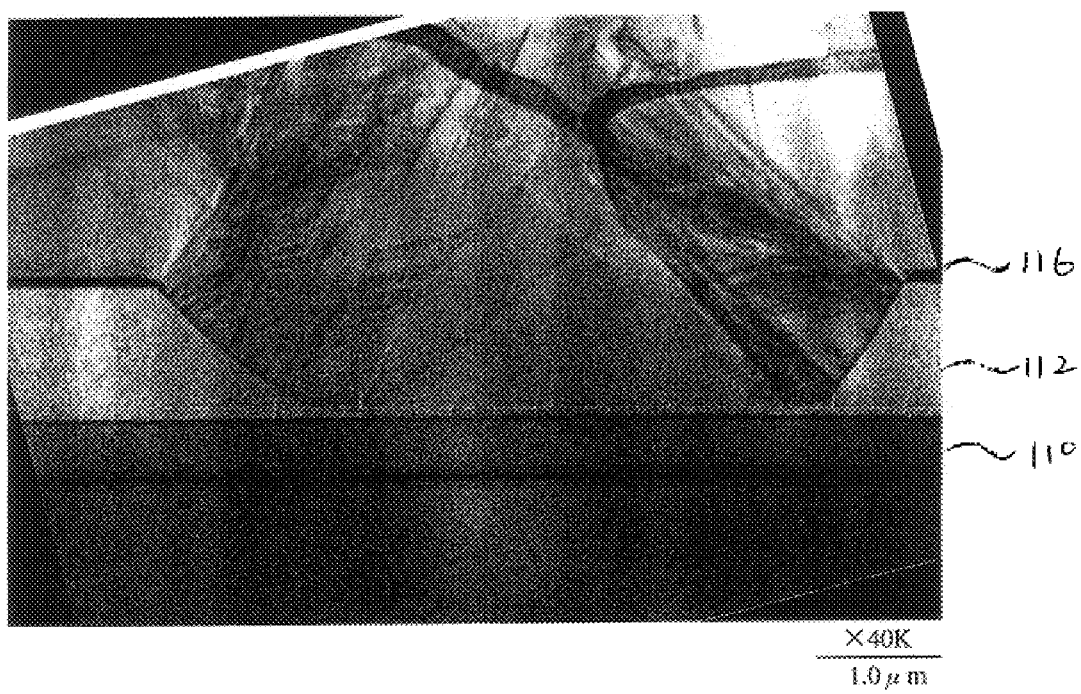
FIG. 7 is a view of a transmission electron microscope (TEM) photograph of a conventional red LD.

FIG. 7 is a view of a transmission electron microscope (TEM) photograph of a conventional red LD, where the photograph shows an area around the opening 114 in a cross section perpendicular to a light emission direction of the red LD 100.

FIG. 7 shows that many lattice defects are formed on a p-$(Al_{0.7}Ga_{0.3})_{0.5}In_{0.5}P$ layer grown on the (111) A facet facing the opening 114 in the n-$Al_{0.5}In_{0.5}P$ layer to be a current blocking layer 112 when forming the p-$(Al_{0.7}Ga_{0.3})_{0.5}In_{0.5}P$ layer to be a second upper clad layer 116 directly on the current blocking layer 112. Thus, the lattice defects may develop due to the following reason.

The surface of the opening 114 in the n-$Al_{0.5}In_{0.5}P$ layer to be a current blocking layer 112 formed by wet etching is a (111) A facet. On a (111) A facet, crystal growth is difficult and furthermore, in the n-$Al_{0.5}In_{0.5}P$ layer to be a current blocking layer 112, an Al content is high, which means higher susceptibility to oxidation. Crystal defects may, therefore, develop in crystal growth on the (111) A facet of the n-$Al_{0.5}In_{0.5}P$ layer. Furthermore, p-$(Al_{0.7}Ga_{0.3})_{0.5}In_{0.5}P$ is such a complex material that deviation in a composition may generate distortion causing crystal defects.

Thus, crystal of p-$(Al_{0.7}Ga_{0.3})_{0.5}In_{0.5}P$ in which composition tends to be deviated is grown on the (111) A facet, on which crystal growth is difficult, of the n-$Al_{0.5}In_{0.5}P$ layer which is likely to form an oxide film. Many lattice defects may be, therefore, formed in the p-$(Al_{0.7}Ga_{0.3})_{0.5}In_{0.5}P$ layer grown on the (111) A facet of the current blocking layer 112 facing the opening 114. In particular, when growing crystal of p-$(Al_{0.7}Ga_{0.3})_{0.5}In_{0.5}P$ which tends to form lattice defects due to, for example, composition deviation, crystal defects may be formed from the initial stage in crystal growth.

In the red LD 10 according to Embodiment 1, during the initial stage of secondary epitaxial growth before crystal-growing of the p-$(Al_{0.7}Ga_{0.3})_{0.5}In_{0.5}P$ layer to be a second upper clad layer 28, the layer of p-$Al_{0.5}Ga_{0.5}As$ which does not generate lattice mismatch due to composition deviation is formed as the second buffer layer 26 on the (111) A facet facing the opening 24 in the n-$Al_{0.5}In_{0.5}P$ layer to be a current blocking layer 22 which is most susceptible to lattice mismatch, on which is then formed the p-$(Al_{0.7}Ga_{0.3})_{0.5}In_{0.5}P$ layer to be a second upper clad layer 28. This can inhibit development of lattice defects during the initial stage of growth to reduce crystal defects in the p-$(Al_{0.7}Ga_{0.3})_{0.5}In_{0.5}P$ layer to be a second upper clad layer 28.

Figure 8:
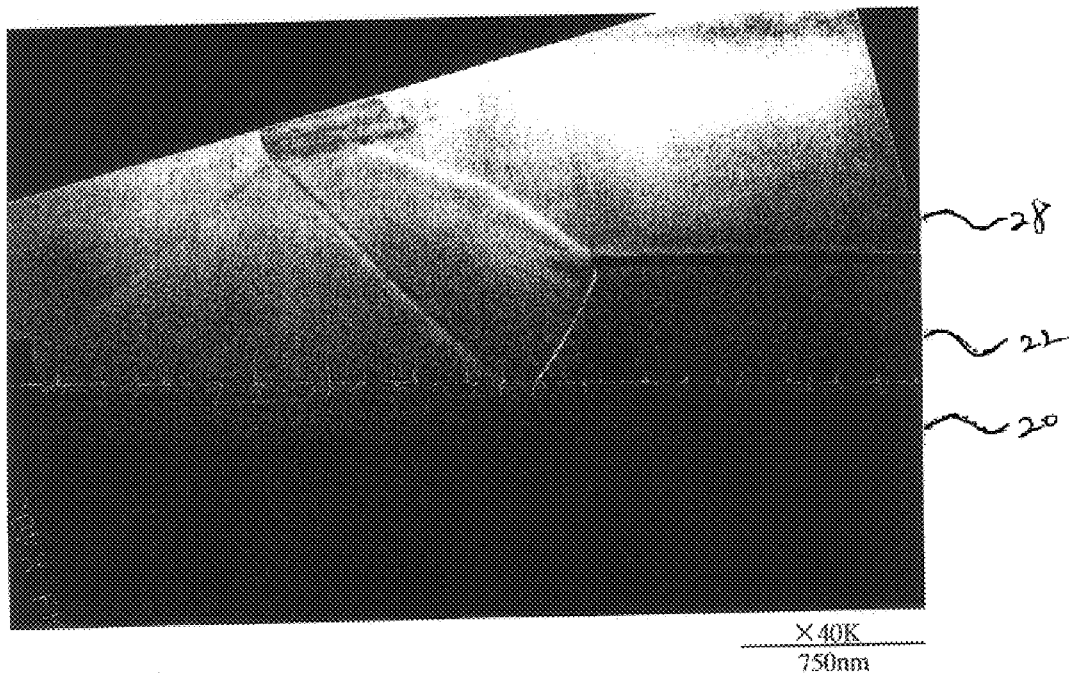
FIG. 8 is a view of a transmission electron microscope (TEM) photograph of a red LD according to the present invention.

FIG. 8 shows a view of a transmission electron microscope (TEM) photograph of the red LD according to Embodiment 1, where the photograph shows an area around the opening 24 in a cross section perpendicular to a light emission direction of the red LD 10.

As seen in FIG. 8, it may be found that there are no lattice defects in the p-$(Al_{0.7}Ga_{0.3})_{0.5}In_{0.5}P$ layer grown on the (111) A facet facing the opening 24 in the n-$Al_{0.5}In_{0.5}P$ layer to be a current blocking layer 22 by forming the p-$Al_{0.5}Ga_{0.5}As$ layer as the second buffer layer 26 and the p-$(Al_{0.7}Ga_{0.3})_{0.5}In_{0.5}P$ layer to be a second upper clad layer 28 on the current blocking layer 22, resulting in good crystal growth.

As described above, in the red LD 10 according to Embodiment 1, crystal defects in the p-$(Al_{0.7}Ga_{0.3})_{0.5}In_{0.5}P$ layer to be a second upper clad layer 28 may be reduced by forming, as the initial growth layer, the p-$Al_{0.5}Ga_{0.5}As$ layer as the second buffer layer 26 on the surface of the exposed p-$(Al_{0.7}Ga_{0.3})_{0.5}In_{0.5}P$ layer to be a first upper clad layer 110 facing the opening 24, on the (111) A facet facing the opening 24 in the n-$Al_{0.5}In_{0.5}P$ layer to be a current blocking layer 22 and on the upper surface of the n-$Al_{0.5}In_{0.5}P$ layer and forming the p-$(Al_{0.7}Ga_{0.3})_{0.5}In_{0.5}P$ layer to be a second upper clad layer 28 on the second buffer layer 26, by secondary epitaxial growth. It may reduce an internal loss in the red LD 10, reduce deterioration in temperature properties in current-optical output performance of the red LD 10 and finally improve reliability of the red LD.

A substrate temperature during this crystal growth is 650° C. to 750° C. which is within a common temperature range for crystal growth. It may reduce diffusion of a p-type dopant Zn from the p-$(Al_{0.7}Ga_{0.3})_{0.5}In_{0.5}P$ layer as the first upper clad layer 20 to the MQW layer to be an active layer 18. It may, therefore, prevent Zn from diffusing into the active layer in the first upper clad layer 20 and may reduce deterioration of temperature properties in current-optical output performance and reliability.

Furthermore, the band gap of the p-$Al_{0.5}Ga_{0.5}As$ layer as the second buffer layer 26 is adjusted to be larger than that of the active layer 18. A laser beam from the active layer 18 may not be, therefore, absorbed and laser properties may not be deteriorated.

Second Embodiment

In a red LD according to Embodiment 2, a current blocking layer made of n-AlInP having a stripe-shaped opening is disposed on a first upper clad layer; a cap layer made of n-$Ga_{0.5}In_{0.5}P$ is disposed on the upper main surface of the current blocking layer; and a p-$(Al_{0.7}Ga_{0.3})_{0.5}In_{0.5}P$ as a second upper clad layer is disposed on the exposed first upper clad layer facing the opening, the surface facing the opening of the current blocking layer and the cap layer, to inhibit lattice defects formed in the p-$(Al_{0.7}Ga_{0.3})_{0.5}In_{0.5}P$ as the second upper clad layer.

Figure 9:
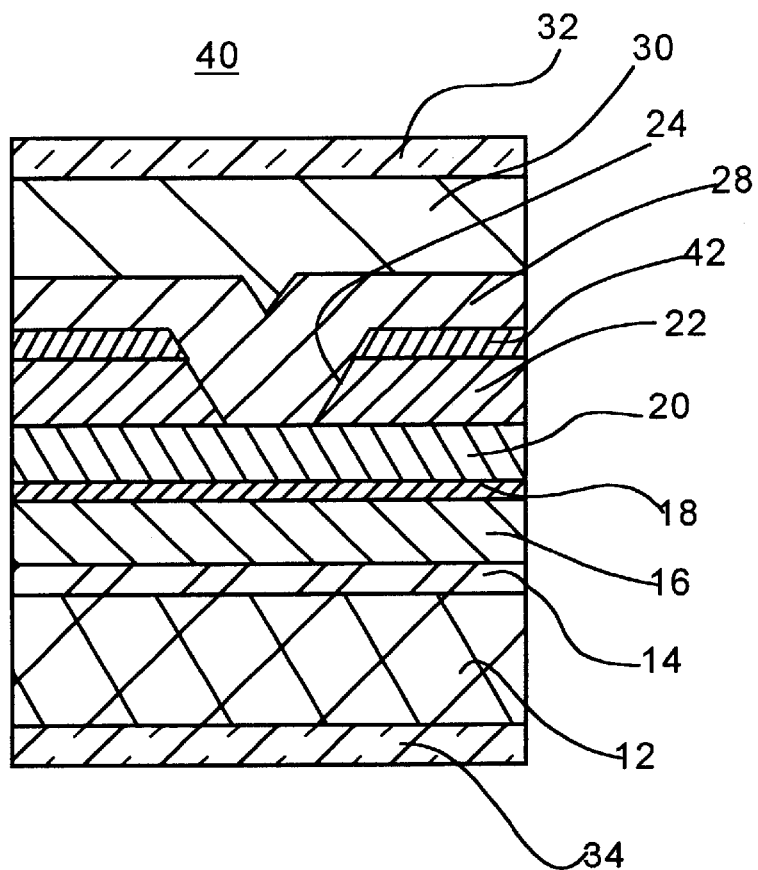
FIG. 9 is a cross-sectional view of the red LD according to the present invention.

FIG. 9 is a cross-sectional view of the red LD according to Embodiment 2 of this invention.

In FIG. 9, reference numeral 40 denotes a red LD; and 42 a cap layer as a protective layer made of n-$Ga_{0.5}In_{0.5}P$. The same symbols as those in FIG. 1 have the same or equivalent meanings, which is applied to Embodiments later.

In the red LD 40, on the (100) facet which is the upper surface of the current blocking layer 22 is formed the cap layer 42, and the opening 24 penetrates the cap layer 42 and the current blocking layer 22. The second upper clad layer is disposed on the exposed first upper clad layer 20 facing the opening 24, the (111) A facet of the current blocking layer 22 facing the opening 24 and the cap layer 42.

There will be described a process for manufacturing a red LD 40.

Figure 10:
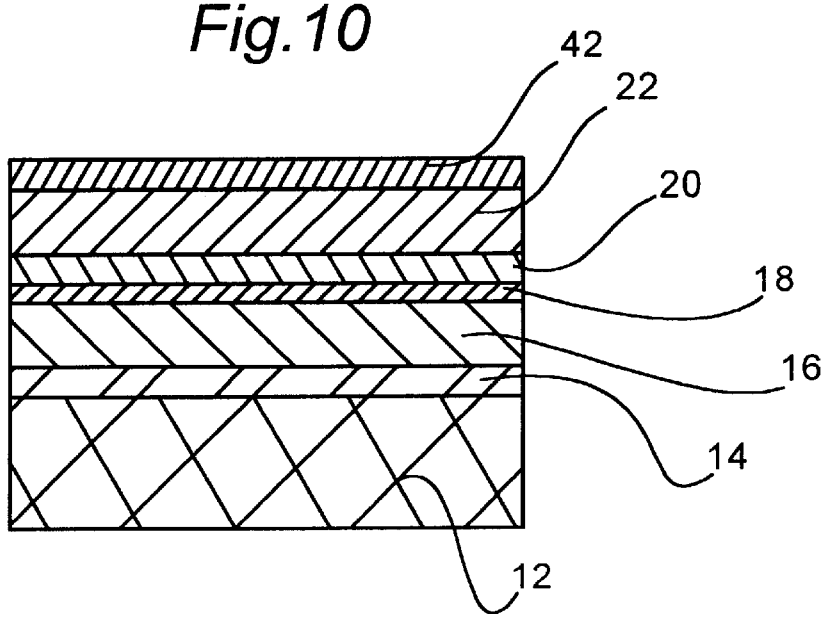
FIG. 10 is a cross-sectional view of the red LD in a manufacturing step according to the present invention.
Figure 11:
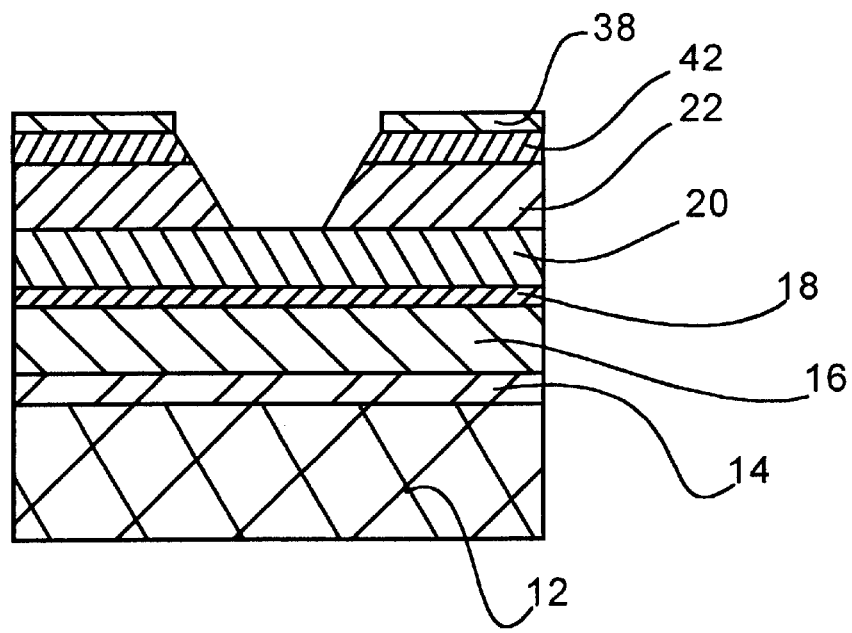
FIG. 11 is a cross-sectional view of the red LD in a manufacturing step according to the present invention.
Figure 12:
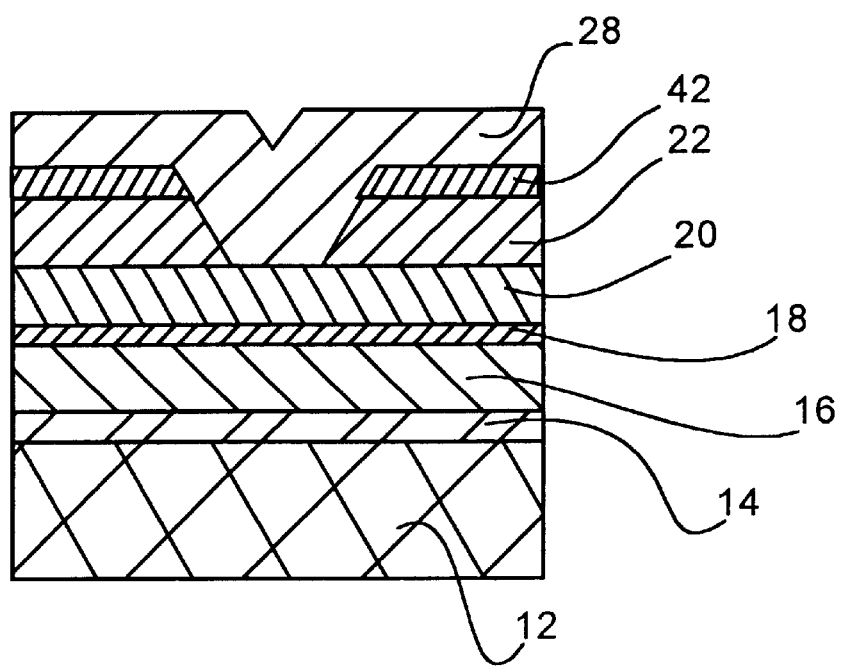
FIG. 12 is a cross-sectional view of the red LD in a manufacturing step according to the present invention.

FIGS. 10, 11 and 12 are cross-sectional views of a red LD in individual manufacturing steps according to Embodiment 2.

On an n-GaAs substrate 12 are sequentially formed an n-GaAs layer to be a first buffer layer 14, an n-$(Al_{0.7}Ga_{0.3})_{0.5}In_{0.5}$ layer to be a lower clad layer 16, a GaInP/AlGaInP MQW layer to be an active layer 18, a p-$(Al_{0.7}Ga_{0.3})_{0.5}In_{0.5}P$ layer to be a first upper clad layer 20, an n-$Al_{0.5}In_{0.5}P$ layer to be a current blocking layer 22, and an n-$Ga_{0.5}In_{0.5}P$ layer to be a cap layer 42, by primary epitaxial growth based on crystal growth such as MOCVD. For a dopant, an n-type dopant is silicon while a p-type dopant is zinc. The results of this step are shown in FIG. 10.

Then, a resist pattern 38 is formed on the surface of the n-$Ga_{0.5}In_{0.5}P$ layer to be a cap layer 42 by a photolithographic process, and a stripe-shaped opening 24 to be a current path is formed in the n-$Ga_{0.5}In_{0.5}P$ layer to be a cap layer 42 and the n-$Al_{0.5}In_{0.5}P$ layer to be the current blocking layer 22 by wet etching. The results of this step are illustrated in FIG. 11.

After removing the resist pattern 38, a p-$(Al_{0.7}Ga_{0.3})_{0.5}In_{0.5}P$ layer to be a second upper clad layer 28 is formed on the surface of the exposed p-$(Al_{0.7}Ga_{0.3})_{0.5}In_{0.5}P$ layer to be a first upper clad layer 20 facing the opening 24, the (111) A facet facing the opening 24 in the n-$Al_{0.5}In_{0.5}P$ layer to be a current blocking layer 22 and the upper surface of the n-$Ga_{0.5}In_{0.5}P$ layer to be a cap layer 42, by secondary epitaxial growth based on crystal growth such as MOCVD. The results of this step are shown in FIG. 12.

Then, a p-GaAs layer to be a contact layer 30 is formed on the p-$(Al_{0.7}Ga_{0.3})_{0.5}In_{0.5}P$ layer to be a second upper clad layer 28.

In this secondary epitaxial growth, a crystal growth temperature is about 650° C. to 750° C. A crystal growth temperature as low as possible is selected to prevent a p-type dopant Zn from diffusing from the p-$(Al_{0.7}Ga_{0.3})_{0.5}In_{0.5}P$ layer as a first upper clad layer 20 to the MQW layer to be an active layer 18 as much as possible.

Then, a p-electrode 32 and an n-electrode 34 are formed on the surface of the p-GaAs layer to be a contact layer 30 and the rear surface of the n-GaAs substrate 12, respectively, to provide a red laser LD 40 shown in FIG. 9.

In the red LD 40, the cap layer 42 made of n-$Ga_{0.5}In_{0.5}P$ which is antioxidative because of absence of Al is disposed on the n-$Al_{0.5}In_{0.5}P$ layer to be a current blocking layer 22, via which is formed the second upper clad layer 28 made of p-$(Al_{0.7}Ga_{0.3})_{0.5}In_{0.5}P$. It may reduce crystal defects in the second upper clad layer 28 which is susceptible to lattice defects due to its tendency to composition deviation to provide a reliable red LD 40.

Third Embodiment

In a red LD according to Embodiment 3, a current blocking layer made of n-AlInP having a stripe-shaped opening is disposed on a first upper clad layer; a cap layer made of n-$Ga_{0.5}In_{0.5}P$ is disposed on the upper main surface of the current blocking layer; and the exposed first upper clad layer facing the opening, the surface facing the opening of the current blocking layer and the cap layer are covered by a p-$Al_{0.5}Ga_{0.5}As$ buffer layer, on which is then disposed a p-$(Al_{0.7}Ga_{0.3})_{0.5}In_{0.5}P$ as a second upper clad layer, to inhibit lattice defects formed in the p-$(Al_{0.7}Ga_{0.3})_{0.5}In_{0.5}P$ as the second clad layer.

Figure 13:
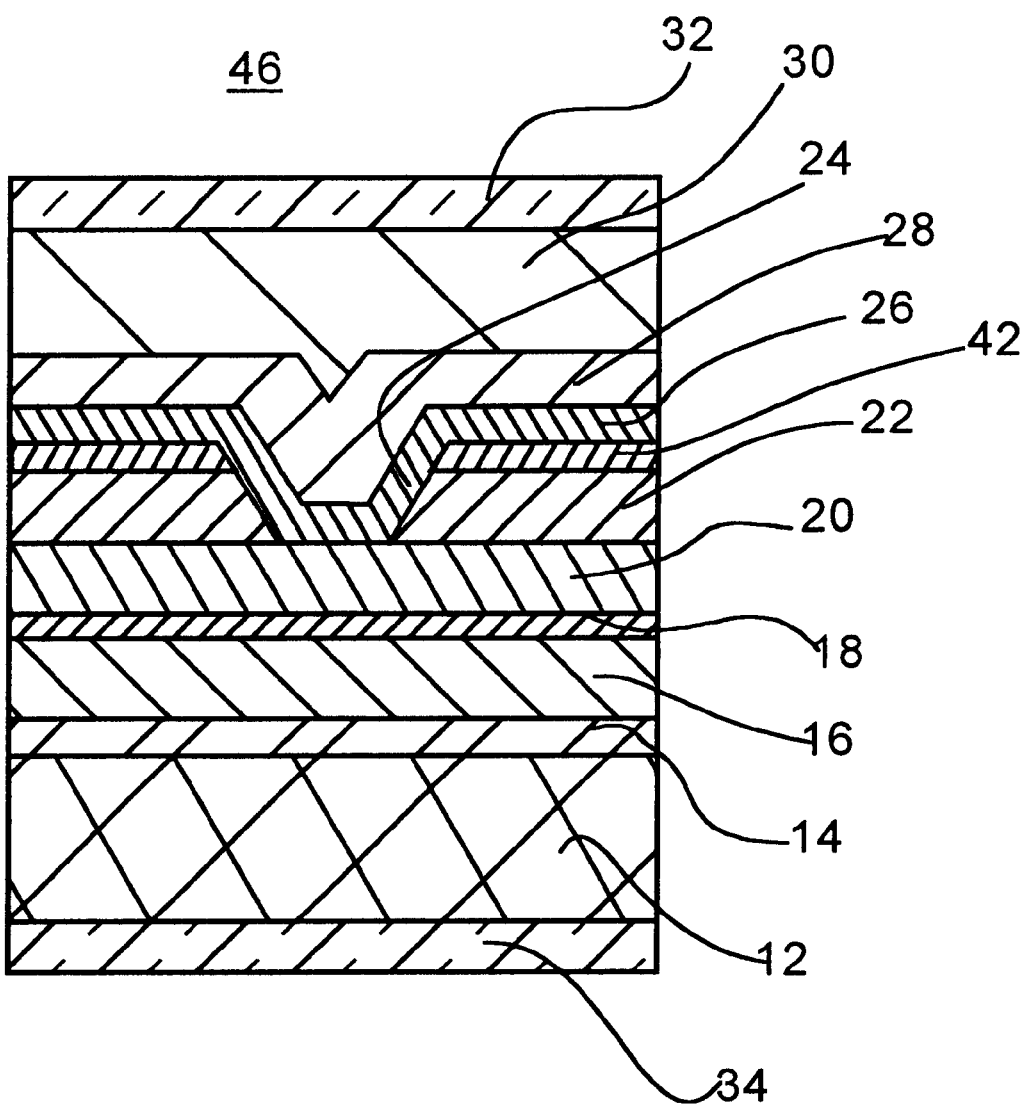
FIG. 13 is a cross-sectional view of the red LD according to the present invention.
Figure 14:
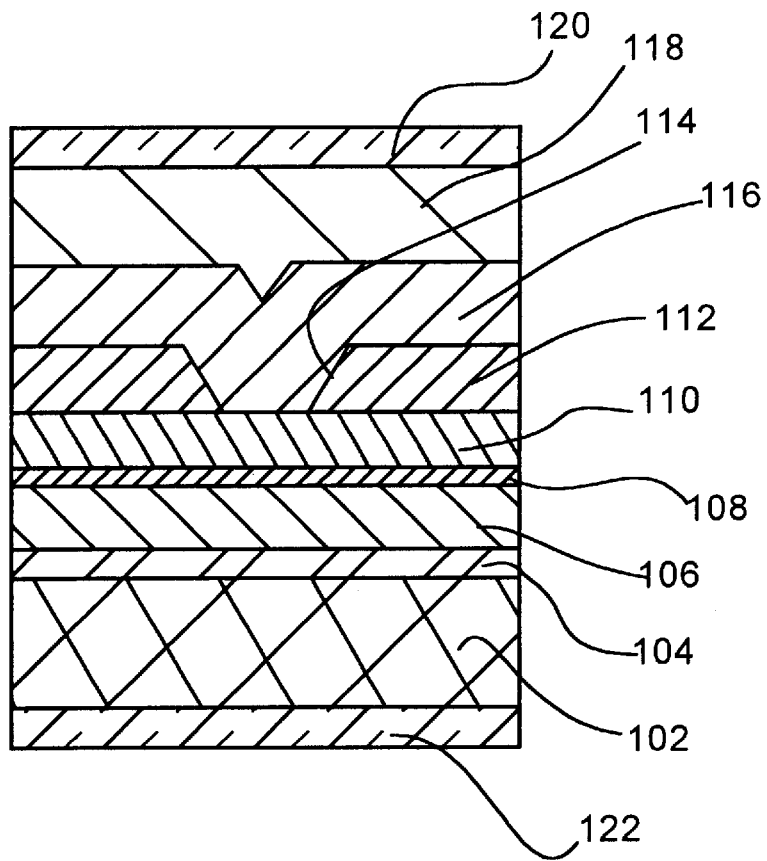
FIG. 14 is a cross-sectional view of the conventional red LD.
Figure 15:
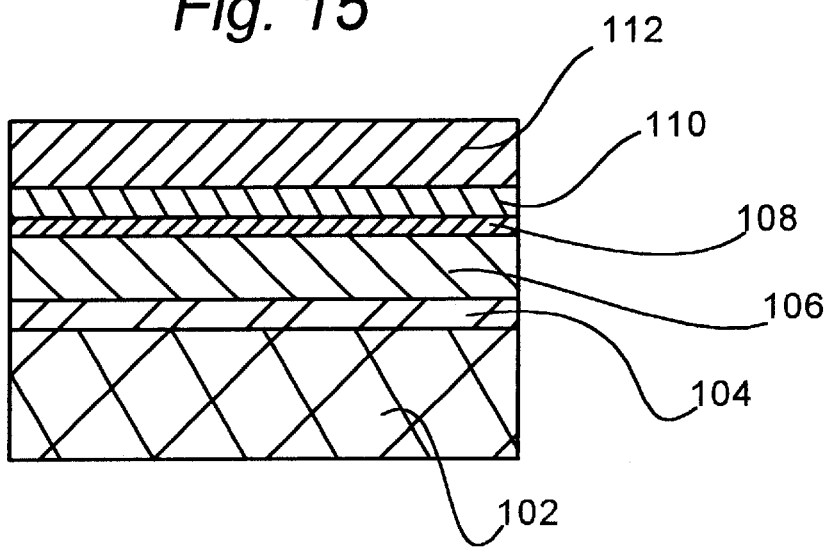
FIG. 15 is a cross-sectional view of the conventional red LD in a manufacturing step.
Figure 16:
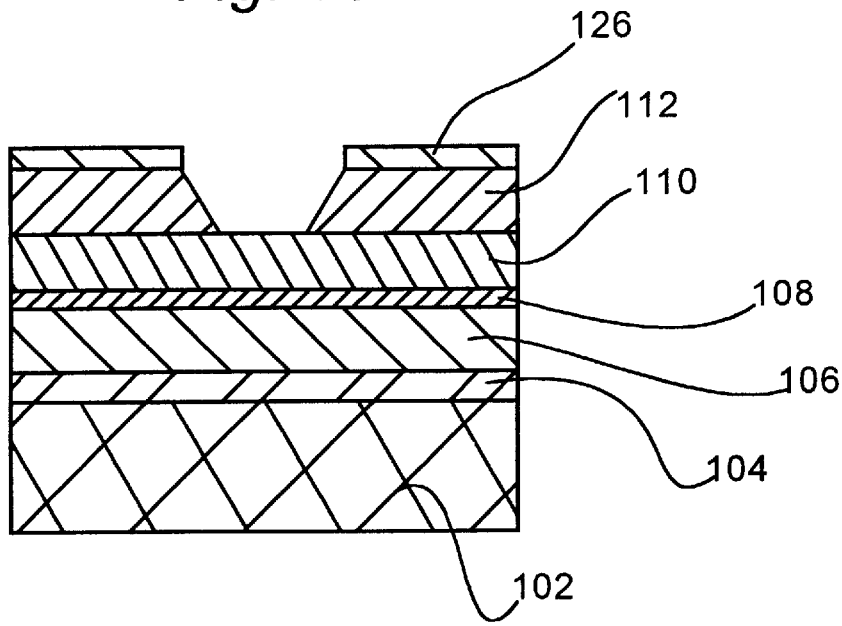
FIG. 16 is a cross-sectional view of the conventional red LD in a manufacturing step.
Figure 17:
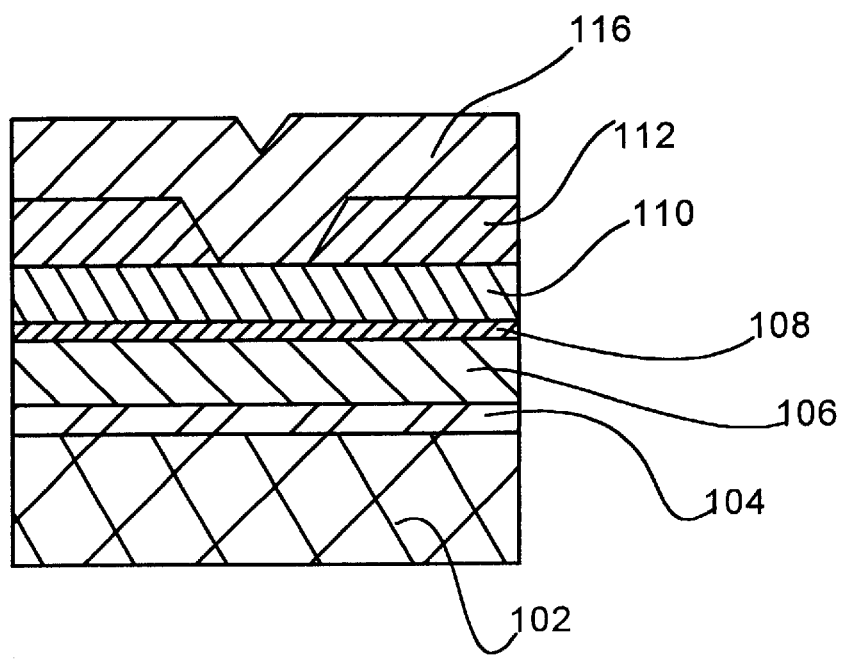
FIG. 17 is a cross-sectional view of the conventional red LD in a manufacturing step.

FIG. 13 is a cross-sectional view of the red LD according to Embodiment 3 of this invention.

In FIG. 13, reference numeral 46 denotes a red LD according to Embodiment 3; and 42 a cap layer as a protective layer made of n-$Ga_{0.5}In_{0.5}P$.

The red LD 46 has the configuration as described for the red LD 10 in Embodiment 1, except that the n-$Ga_{0.5}In_{0.5}P$ as a cap layer 42 is disposed on the n-$Al_{0.5}In_{0.5}P$ layer to be a current blocking layer 22 by primary epitaxial growth.

There will be described the reason why the n-$Ga_{0.5}In_{0.5}P$ layer as a cap layer 42 is formed. The n-$Al_{0.5}In_{0.5}P$ layer to be a current blocking layer 22 is susceptible to oxidization due to its higher Al contents. The surface of the n-$Al_{0.5}In_{0.5}P$ layer to be a current blocking layer 22 is a crystal facet in which crystal growth is easier than the (111) A facet in the n-$Al_{0.5}In_{0.5}P$ layer facing the opening 24. Nonetheless, an oxide film formed may cause lattice defects during epitaxial growth of p-$(Al_{0.7}Ga_{0.3})_{0.5}In_{0.5}P$ as the second upper clad layer.

The n-$Ga_{0.5}In_{0.5}P$ layer as the cap layer 42 is, therefore, disposed on the (100) facet in the n-$Al_{0.5}In_{0.5}P$ layer to be a current blocking layer 22 to prevent the formation of oxide film and inhibit the development of lattice defects during epitaxial growth of p-$(Al_{0.7}Ga_{0.3})_{0.5}In_{0.5}P$ as the second upper clad layer. Furthermore, on the (111) A facet facing the opening 24 in the n-$Al_{0.5}In_{0.5}P$ layer to be a current blocking layer 22 is formed the p-$Al_{0.5}Ga_{0.5}As$ layer as a second buffer layer 26, on which is then formed the p-$(Al_{0.7}Ga_{0.3})_{0.5}In_{0.5}P$ layer to be a second upper clad layer 28. This can inhibit development of lattice defects during the initial stage of growth to reduce crystal defects in the p-$(Al_{0.7}Ga_{0.3})_{0.5}In_{0.5}P$ layer to be a second upper clad layer 28.

The red LD 46, therefore, exhibits higher laser reliability and yield than the red LD 10.

Although the conductivity type of the cap layer 42 has been n-type in Embodiments 2 and 3, it may be p-type or of higher resistance, which may provide similar effects.

In these Embodiments, the clad layer may, of course, have a different composition.

There may be provided the following effects by a semiconductor laser device according to this invention or a manufacturing process thereof which has the above configuration or steps.

A semiconductor laser device according to this invention comprises a first conductivity type of semiconductor substrate; a first conductivity type of first clad layer made of a III-V group compound semiconductor disposed on the semiconductor substrate; an active layer made of a III-V group compound semiconductor having a smaller band gap than the first clad layer, disposed on the first clad layer; a second conductivity type of first second-clad layer made of a III-V group compound semiconductor having a larger band gap than the active layer, disposed on the active layer; a first conductivity type of current blocking layer made of a III-V group compound semiconductor having a larger band gap than the active layer, disposed on the first second-clad layer and having a stripe-shaped opening to be a current path; a second conductivity type of buffer layer made of a III-V group compound semiconductor having a larger band gap than the active layer, disposed on the surface of the current blocking layer facing the opening; and a second conductivity type of second second-clad layer made of a III-V group compound semiconductor having a larger band gap than the active layer, disposed on the first second-clad layer facing the opening and the current blocking layer via the buffer layer. In this semiconductor laser device, lattice defects in the second second-clad layer disposed on the surface of the current blocking layer facing the opening via the buffer layer may reduce, and it can be prevented from a second conductivity type of dopant diffusing from the first second-clad layer to the active layer, thus the construction according to the present invention making it possible to reduce deterioration in temperature properties in current-optical output performance, and consequently to improve reliability of the semiconductor laser device.

In the semiconductor laser device wherein the current blocking layer, the buffer layer and the second second-clad layer are made of an AlInP material, an AlGaAs material and an AlGaInP material, respectively, lattice defects may be effectively reduced in the second second-clad layer disposed on the surface of the current blocking layer via the buffer layer, leading to improvement in reliability of the semiconductor laser device with a red LD.

In the semiconductor laser device wherein a protective layer made of a GaInP material is further disposed between the surface of the current blocking layer except the surface facing the opening and the second second-clad layer, a risk of lattice defect formation may be reduced in the second second-clad layer made of an AlGaInP material whose composition tends to be deviated, even on the main surface of the current blocking layer except the surface facing the opening, and may allow us to provide a semiconductor laser device with a red LD with a higher yield.

A semiconductor laser device according to this invention comprises a first conductivity type of semiconductor substrate; a first conductivity type of first clad layer made of a III-V group compound semiconductor disposed on the semiconductor substrate; an active layer made of a III-V group compound semiconductor having a smaller band gap than the first clad layer, disposed on the first clad layer; a second conductivity type of first second-clad layer made of a III-V group compound semiconductor having a larger band gap than the active layer, disposed on the active layer; a first conductivity type of current blocking layer made of an AlInP material having a larger band gap than the active layer, disposed on the first second-clad layer and having a stripe-shaped opening to be a current path; a protective layer made of a GaInP material disposed on the surface of the current blocking layer except the surface facing the opening; and a second conductivity type of second second-clad layer made of an AlGaInP material having a larger band gap than the active layer, disposed on the current blocking layer via the protective layer and the first second-clad layer facing the opening. In this device, the current blocking layer made of the AlInP material is protected by the GaInP material not containing Al and the second second-clad layer made of the AlGaInP material whose composition tends to be deviated is disposed on the crystal facet with a reduced amount of oxide film to further reduce a risk of lattice defect formation, leading to improvement in reliability of a semiconductor laser device with a red LD.

A process for manufacturing a semiconductor laser device according to this invention also includes the steps of depositing a first conductivity type of first clad layer made of a III-V group compound semiconductor, an active layer made of a III-V group compound semiconductor having a smaller band gap than the first clad layer, a second conductivity type of first second-clad layer made of a III-V group compound semiconductor having a larger band gap than the active layer, and a first conductivity type of current blocking layer made of a III-V group compound semiconductor having a larger band gap than the active layer on the first second-clad layer in order, on a first conductivity type of semiconductor substrate; forming a stripe-shaped opening penetrating the current blocking layer; forming a second conductivity type of buffer layer made of a III-V group compound semiconductor having a larger band gap than the active layer on the surface of the current blocking layer facing the opening; and forming a second conductivity type of second second-clad layer made of a III-V group compound semiconductor having a larger band gap than the active layer on the first second-clad layer facing the opening and the current blocking layer via the buffer layer, and may allow the crystal of the second second-clad layer to grow with reduced lattice defects on the surface of the current blocking layer facing the opening via the buffer layer, even at a common substrate temperature. Such a common substrate temperature may reduce diffusion of a second conductivity type of dopant from the first second-clad layer to the active layer during crystal growth.

Accordingly, a process for manufacturing a semiconductor laser device according to this invention may allow us to manufacture a reliable semiconductor laser device with reduced deterioration in temperature properties in current-optical output performance by simple steps and consequently to provide, with a low price, a semiconductor laser device exhibiting excellent laser properties.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2000-330117, filed on Oct. 30, 2000 including specification, claims, drawings and summary, on which the Convention priority of the present application is based, are incorporated herein by reference in its entirety.

What is claimed is:

1. A semiconductor laser device comprising:
   a semiconductor substrate of a first conductivity type;
   a III-V semiconductor first cladding layer of a first conductivity type, disposed on the semiconductor substrate;
   a III-V semiconductor active layer having a smaller band gap than the first cladding layer, disposed on the first cladding layer;

a III-V semiconductor first second-cladding layer of a second conductivity type, opposite the first conductivity type, having a larger band gap than the active layer, and disposed on the active layer;

a III-V semiconductor current blocking layer of the first conductivity type, having a larger band gap than the active layer, disposed on the first second-cladding layer, and having a stripe-shaped opening;

a III-V semiconductor buffer layer of the second conductivity type, having a larger band gap than the active layer, and disposed on a surface of the current blocking layer, facing the opening; and a III-V semiconductor second second-cladding layer of the second conductivity type, having a larger band gap than the active layer, and disposed on the first second-cladding layer, facing the opening, and the current blocking layer with the buffer layer intervening.

2. The semiconductor laser device according to claim 1, wherein the current blocking layer, the buffer layer, and the second second-cladding layer are AlInP, AlGaAs, and AlGaInP, respectively.

3. The semiconductor laser device according to claim 2, including a protective layer of GaInP disposed between the surface of the current blocking layer, except the surface facing the opening, and the second second-cladding layer.

4. A semiconductor laser device comprising:

a semiconductor substrate of a first conductivity type;

a III-V semiconductor first cladding layer of a first conductivity type, disposed on the semiconductor substrate;

a III-V semiconductor active layer having a smaller band gap than the first cladding layer, and disposed on the first cladding layer;

a III-V semiconductor first second-cladding layer of a second conductivity type, opposite the first conductivity type, having a larger band gap than the active layer, and disposed on the active layer;

a current blocking layer of the first conductivity type, of AlInP, having a larger band gap than the active layer, disposed on the first second-cladding layer, and having a stripe-shaped opening;

a protective layer of GaInP disposed on the current blocking layer, except on a surface facing the opening; and a second second-cladding layer of the second conductivity type, of AlGaInP, having a larger band gap than the active layer, and disposed on the current blocking layer with the protective layer intervening, and on the first second-cladding layer facing the opening.

* * * * *